(12) United States Patent
Fujieda et al.

(10) Patent No.: US 7,151,268 B2
(45) Date of Patent: Dec. 19, 2006

(54) FIELD EMISSION GUN AND ELECTRON BEAM INSTRUMENTS

(75) Inventors: Tadashi Fujieda, Mito (JP); Kishio Hidaka, Hitachiota (JP); Mitsuo Hayashibara, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 134 days.

(21) Appl. No.: 11/059,511

(22) Filed: Feb. 17, 2005

(65) Prior Publication Data

US 2005/0212440 A1    Sep. 29, 2005

(30) Foreign Application Priority Data

Mar. 26, 2004    (JP)    ............................ 2004-090806

(51) Int. Cl.
*H01J 37/073*    (2006.01)

(52) U.S. Cl. .................. 250/396 R; 250/397; 250/398

(58) Field of Classification Search ............ 250/396 R, 250/397, 398
See application file for complete search history.

(56) References Cited

U.S. PATENT DOCUMENTS 5,196,707 A * 3/1993 Gesley ....................... 250/398
5,895,919 A * 4/1999 Frosien et al. .......... 250/396 R

FOREIGN PATENT DOCUMENTS

| JP | 06-162978 | 6/1994 |
| JP | 11-144663 | 5/1999 |
| JP | 2004-079223 | 3/2004 |

OTHER PUBLICATIONS

Purcell et al.; "Hot Nanotubes: Stable Heating of Individual Multiwall Carbon Nanotubes to 2000 K Induced by the Field-Emission Current"; *Physical Review Letters*; The American Physical Society; c. 2002; vol. 88, No. 10; pp. 105502-1-105502-4.

* cited by examiner

*Primary Examiner*—David Vu
(74) *Attorney, Agent, or Firm*—McDermott Will & Emery LLP (57) ABSTRACT

A field-emission electron gun includes a field-emission cathode including a single fiber-like carbon substance and an electrically-conductive substrate for supporting the substance, an extractor for field-emitting electrons, an accelerating electrode for accelerating the electrons, an extracting power-supply for applying extracting voltage to the extractor, an accelerating power-supply for applying accelerating voltage to the accelerating electrode, and a unit for detecting and monitoring a part of emission current. In this field-emission electron gun, if emission-variation amount has become larger than a predetermined value, the extracting voltage is automatically boosted for a constant length of time, thereby increasing the emission current up to a predetermined value. Further, extracting voltage at the time of boosting the extracting voltage, voltage-boosting time, and the emission current are recorded, then being feed-backed to voltage-boosting conditions for the next-time extracting voltage. Moreover, the accelerating voltage is varied in correspondence with the voltage-boosting of the extracting voltage.

9 Claims, 5 Drawing Sheets

FIELD EMISSION GUN AND ELECTRON BEAM INSTRUMENTS

BACKGROUND OF THE INVENTION

1. Field of the Invention

The present invention relates to a field-emission electron gun, and electron-beam instruments mounting the same electron gun thereon.

2. Description of the Related Art

Figure 1:
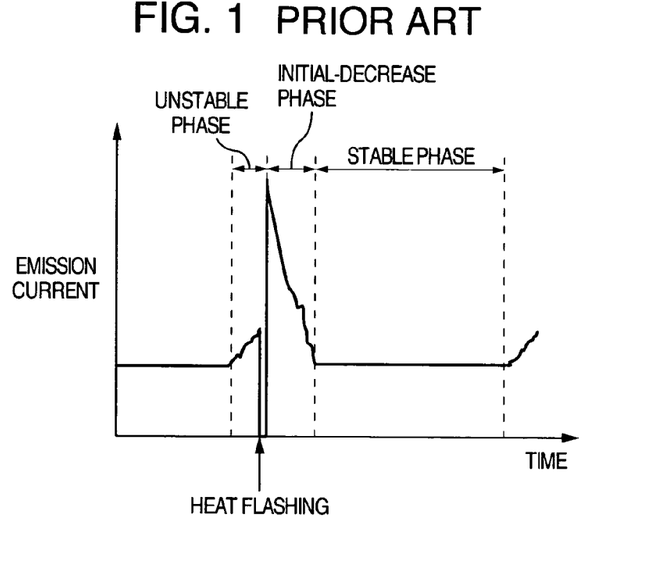
FIG. 1 illustrates the time-lapse change in the emission current in the conventional field-emission electron gun.

FIG. 1 illustrates a time-lapse change in the emission current in a conventional field-emission electron gun including a single-crystal tungsten cathode. If the electron gun continues to be used for 2 to 12 hours, as illustrated in FIG. 1, the emission current becomes unstable because of a configuration change in the cathode surface and gas adherence onto the cathode surface. This, eventually, results in a breakage of the tungsten cathode itself. This situation requires execution of a heat flashing processing (which, hereinafter, will be referred to as "flashing") for current-pass heating the tungsten cathode periodically. The execution of the flashing melts away the cathode surface, thereby renovating the asperities which are formed by ion impact, and removing the gas molecules which adhere onto the cathode surface. This execution is considered to stabilize the emission current. A technology concerning this flashing has been disclosed in JP-A-11-144663.

Figure 2:
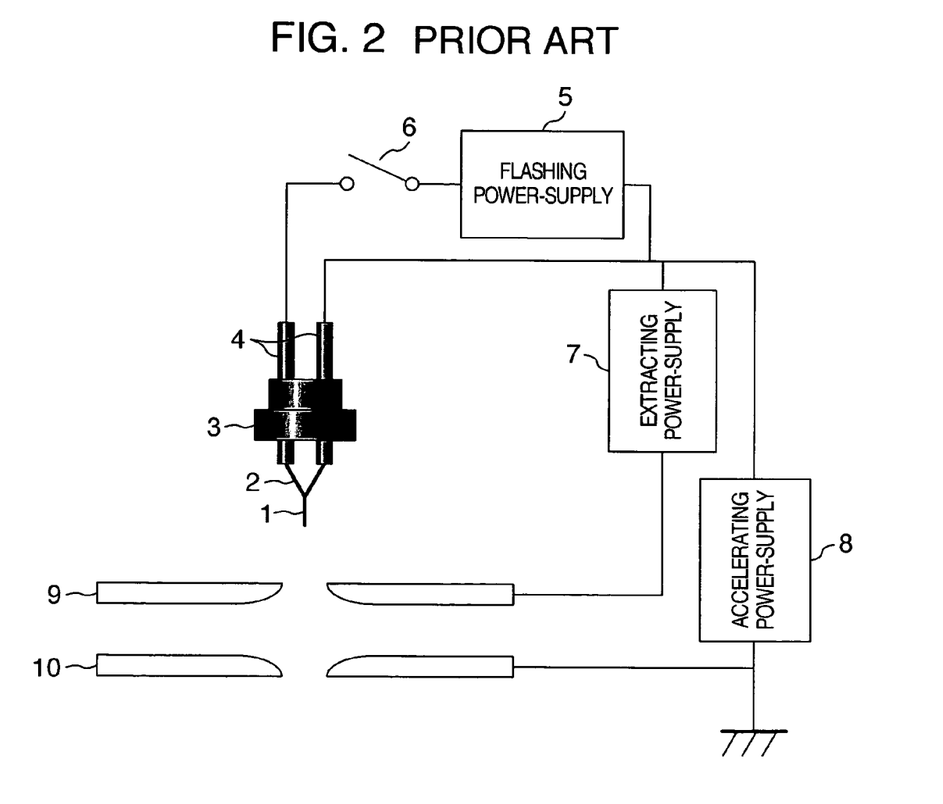
FIG. 2 illustrates the configuration diagram of the conventional field-emission electron gun.

FIG. 2 is a configuration diagram of the conventional field-emission electron gun. Here, the reference numerals denote the following configuration components: 1 a single-crystal tungsten cathode, 2 an electrically-conductive filament, 3 an electrode support base, 4 electrodes, 5 a heat flashing power-supply, 6 a heat flashing switch, 7 an extracting power-supply, 8 an accelerating power-supply, 9 an extractor, and 10 an accelerating electrode. As illustrated in FIG. 1, at the time of the flashing, it is required to stop the emission current once by dropping down extracting voltage and accelerating voltage. This makes it impossible to implement long-time continuous operation of the conventional field-emission electron gun. On account of this, despite the fact that the electron gun has supreme performance as a conventional electron source, its application range is limited to a high-resolution electron microscope for research purpose. As a consequence, there exists a serious problem that the electron gun is inapplicable to inspection devices such as a length-measuring SEM which is continuously driven on a semiconductor inspection line or the like.

Also, as illustrated in FIG. 1, the emission current decreases after the flashing, and it takes 0.5 to 3 hours to attain to a stable region of the emission current. As a result, maintaining the emission current at the constant value requires that the extracting voltage be boosted. This voltage-boosting changes ratio between the extracting voltage and initial-stage accelerating voltage, thereby changing electrostatic-lens function as well, and thus shifting optical axis. As a solving measure therefor, the following method has been disclosed in JP-A-6-162978: Namely, the extracting voltage is made variable so that the emission current is maintained at the constant value, and at the same time, the initial-stage accelerating voltage is changed in synchronization with the change in the extracting voltage. This processing allows the electrostatic-lens function to remain unchanged, thereby eliminating the shift of the optical axis of the electron-gun unit. It is impossible, however, to solve the problem of an optical-axis shift caused by heat deformation of the cathode itself due to repetition of the flashing. In this way, it is required to execute the flashing characteristic of the field-emission electron gun, and an optical-axis adjustment processing in accompaniment therewith. Accordingly, even if the electron gun is applied to a general-purpose SEM, the electron gun presents the problem in a point of its ease-of-use.

SUMMARY OF THE INVENTION

It is a first object of the present invention to provide a field-emission electron gun and its driving method. Here, the field-emission electron gun operates continuously for a long time, and necessitates none of the optical-axis adjustment during the continuous operation.

It is a second object of the present invention to provide high-resolution electron-beam instruments capable of operating continuously for a long time.

A unit for accomplishing the first object of the present invention is as follows: In a field-emission electron gun which includes a field-emission cathode including a single fiber-like carbon substance and an electrically-conductive substrate for supporting the substance, an extractor for field-emitting electrons, an accelerating electrode for accelerating the electrons, an extracting power-supply for applying extracting voltage to the extractor, an accelerating power-supply for applying accelerating voltage to the accelerating electrode, and a unit for detecting and monitoring a part of emission current, if the emission current has exceeded a specified current variation width, the extracting voltage is automatically boosted for a constant length of time, thereby increasing the emission current up to a predetermined value so as to stabilize the emission current.

In addition to the above-described method, extracting voltage at the time of boosting the extracting voltage, voltage-boosting time, and the emission current are recorded, and then are feed-backed to voltage-boosting conditions for the next-time extracting voltage.

Moreover, the accelerating voltage is varied in correspondence with the voltage-boosting of the extracting voltage.

Also, if the emission current has exceeded the specified current variation width, the extracting voltage is automatically boosted for 5 to 900 seconds, thereby increasing the emission current up to 1 to 100 μA.

The field-emission cathode including the above-described single fiber-like carbon substance includes a carbon nanotube.

A method for accomplishing the second object of the present invention is to apply the electron gun of the present invention and its driving method to the respective types of electron-beam instruments.

It becomes possible to provide the field-emission electron gun and its driving method, the field-emission electron gun necessitating none of the optical-axis adjustment during the continuous operation. Simultaneously, it becomes possible to provide the high-resolution electron-beam instruments capable of operating continuously for a long time.

Other objects, features and advantages of the invention will become apparent from the following description of the embodiments of the invention taken in conjunction with the accompanying drawings.

DESCRIPTION OF THE INVENTION

Referring to the drawings, the detailed explanation will be given below concerning embodiments of the present invention.

Figure 3:
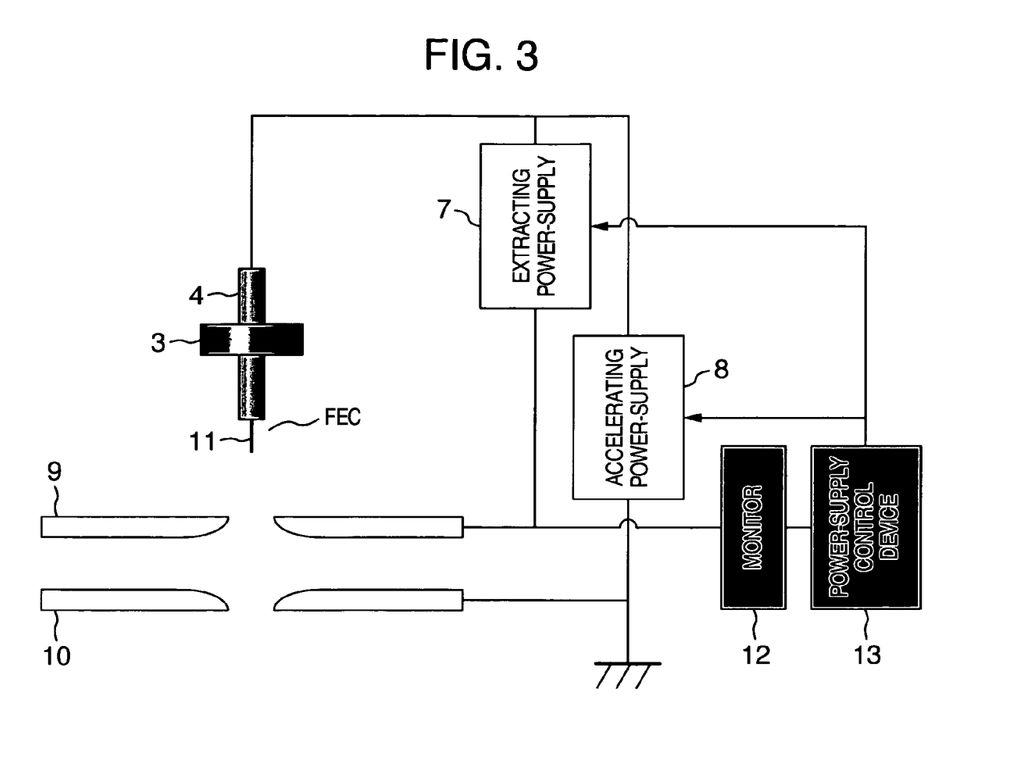
FIG. 3 illustrates a configuration diagram of a field-emission electron gun according to the present embodiment.

FIG. 3 illustrates configuration of a field-emission electron gun according to the present embodiment. The electron gun according to the present embodiment includes a field-emission cathode FEC including a single fiber-like carbon substance 11 and an electrically-conductive substrate for supporting the substance 11, an extractor 9 for field-emitting electrons, an accelerating electrode 10 for accelerating the electrons, an extracting power-supply 7 for applying extracting voltage to the extractor 9, an accelerating power-supply 8 for applying accelerating voltage to the accelerating electrode 10, an emission-current monitor device 12 for detecting and monitoring a part of emission current, and a power-supply control device 13 for controlling the extracting power-supply 7 and the accelerating power-supply 8. Incidentally, a feed-back control circuit is integrated into the power-supply control device 13. This feed-back control circuit recodes extracting voltage at the time of boosting the extracting voltage, voltage-boosting time, and the emission current. Then, this circuit feed-backs these recorded values to voltage-boosting conditions for the next-time extracting voltage.

Figure 4A:
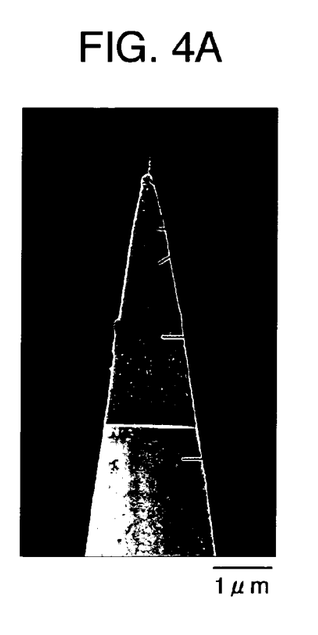
FIG. 4A and FIG. 4B illustrate SEM photographs of a tip-end portion of a field-emission cathode according to the present embodiment.
Figure 4B:
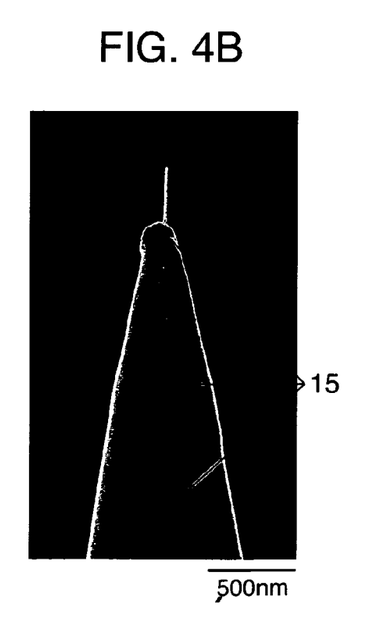

FIG. 4A and FIG. 4B illustrate SEM photographs of a tip-end portion of the field-emission cathode FEC according to the present embodiment. The field-emission cathode includes a single carbon nanotube 14, the electrically-conductive substrate 16, an insulating support base 3 for supporting the substrate 16, and electrodes 4. A joint portion 17 for establishing joint between the carbon nanotube 14 and the electrically-conductive substrate 16 is reinforced by an electrically-conductive coating layer 15.

From the viewpoint of the field-emission characteristics, electrical-resistance ratio, and durability, it is preferable that the configuration of the carbon nanotube 14 be 10 nm to 200 nm in diameter and several 100 nm to several 10 μm in length. Also, aside from the carbon nanotube, whatever fiber-like substance is applicable as the field-emission cathode FEC of the present embodiment as long as its configuration is basically the same as the above-described configuration and its main constituent is carbon.

As the material of the electrically-conductive substrate 16, although not specifically limited, the following substances are preferable from the viewpoint of the melting point, acid-resistant property, and mechanical strength: A precious metal (concretely, gold, silver, or platinum family), crystalline carbon, or a high melting-point metal (concretely, tungsten, tantalum, niobium, molybdenum, or the like).

Also, using the FIB machining or the like, a flat plane is formed at a tip-end portion of the electrically-conductive substrate 16 the tip-end of which has been sharpened by a chemical etching or the like. This flat-plane formation is performed so that an angle formed between central axis of the electrically-conductive substrate 16 and the carbon nanotube 14 can be controlled. Incidentally, when considering a radiation angle of the electron beam emitted from the carbon nanotube 14, making optical-axis adjustment to the electron beam becomes difficult unless the angle formed between the central axis of the electrically-conductive substrate 16 and the carbon nanotube 14 is made smaller than ±5°.

Also, it is preferable that, immediately before jointing the electrically-conductive substrate 16 with the carbon nanotube 14, an oxide film or carbon contamination layer formed on joint planes be eliminated up to the largest possible degree.

The reason for this preference is as follows: Namely, if the electrically-conductive substrate 16 has been jointed with the carbon nanotube 14 in a state where the oxide film or carbon contamination layer with a high electrical-resistance ratio intervenes therebetween, the following problems will occur: (1) Contact electrical-resistance between the carbon nanotube 14 and the electrically-conductive substrate 16 becomes higher, thereby obstructing the electron-beam emission. As a result, emitted current becomes saturated, thereby making it impossible to acquire the emission current which is large in amount. (2) When the emission current has been increased, heat generation or heat liberation in the joint portion 17 brings about a destruction of the carbon nanotube 14 or the electrically-conductive substrate 16. (3) When the emission current has been increased, in accompaniment with a temperature rise in the carbon nanotube 14 by the heat liberation in the joint portion 17, thermoelectron emission also occurs from the carbon nanotube 14 simultaneously. This makes energy width of the emitted electrons extremely large.

Incidentally, the above-described carbon contamination layer refers to amorphous carbon with a high electrical-resistance ratio. This amorphous carbon is produced as follows: Namely, at a processing step of establishing the joint between the electrically-conductive substrate 16 and the carbon nanotube 14 within an electron microscope, the electron beam decomposes substances such as hydrocarbon which remains in an electron-microscope sample chamber, and thereby produces this amorphous carbon.

Incidentally, the following methods make it possible to eliminate the high-electrical-resistance-ratio oxide film or carbon contamination layer: (i) The joint portion with the electrically-conductive substrate 16 is subjected to an ion sputter processing. (ii) These layers are heated up to a temperature at which these layers will be decomposed and evaporated. (iii) Voltage is applied between the carbon nanotube 14 and the electrically-conductive substrate 16, thereby field-emitting electrons from the carbon nanotube 14. This allows elimination of the carbon contamination layer on the joint-portion surface of the carbon nanotube 14.

Also, when, in order to stabilize the emission current, the emission current from the carbon nanotube 14 has been increased by boosting the extracting voltage, electrostatic force (which is attractive force here) by the electric field acted between the carbon nanotube 14 and the extractor 9 is also increased. As a consequence, in some cases, the carbon nanotube 14 flakes off from the electrically-conductive substrate 16. This situation requires that a sufficient joint strength be ensured by forming the electrically-conductive coating layer 15 on at least a part of the affixing portion of the carbon nanotube 14 to the electrically-conductive substrate 16.

Hereinafter, the explanation will be given below concerning a formation method of forming the electrically-conductive coating layer 15. Within a chamber into which an organic gas or fluoride gas including an electrically-conductive element has been introduced, at least a part of the contact portion is irradiated with electron beam. This irradiation allows the sufficiently-thick electrically-conductive coating layer 15 to be formed in a short time. This method makes it possible to locally coat, joint and reinforce only the joint portion 17 between the carbon nanotube 14 and the electrically-conductive substrate 16 without permitting the electrically-conductive coating element to adhere to the carbon nanotube 14 which protrudes from the electrically-conductive substrate 16.

As the organic gas including the electrically-conductive element, an organic gas is unusable which is decomposable only by such high-energy heavy-ion beam as gallium-ion beam usually used in the FIB or the like. The reason for this is as follows: If the carbon nanotube 14 has been irradiated with such high-energy heavy-ion beam, the carbon nanotube 14 itself is damaged in an instant, thereby being ruptured or being caused to have an irradiation defect. On account of this, as the particle beam to be used for decomposing the organic gas or fluoride gas, 100-KeV-or-lower electron beam is preferable which gives no damage to the carbon nanotube 14. Also, as the organic gas, such substances as pyren monomer and tungsten carbonyl or $WF_6$ are preferable which are decomposable by the 100-KeV-or-lower electron beam and which are vaporized at 100° C. or lower. Irradiating these organic gases with the electron beam allows such electrically-conductive material as carbon layer or tungsten layer to be locally formed on only the joint portion 17 between the carbon nanotube 14 and the electrically-conductive substrate 16.

The use of the field-emission cathode FEC including the above-described single carbon nanotube 14 allows implementation of the field-emission electron gun according to the present invention and its driving method which will be explained later.

Next, the explanation will be given below concerning a stabilization method of stabilizing the emission current in the case where the emission current becomes unstable. Recently, S. T. Purcell et al. have disclosed the following findings in S. T. Purcell et al., Phys. Rev. Lett. 88, 105502-1 (2002): Namely, the emission current is stabilized by increasing the emission current for a short time in a cathode which is configured such that carbon nanotubes in plural number are caused to grow directly on a Ni substrate by using the CVD method.

From the following reasons, however, this cathode is inapplicable to the electron gun for such electron-beam instruments as an electron microscope according to the present invention: (1) Since this cathode includes the plural carbon nanotubes, electron beams in plural number are radiated. This makes it difficult to converge the electron beams. (2) From this reason (1), a variation occurs among characteristics of the respective electron beams emitted from the respective carbon nanotubes. This makes it impossible to acquire electron beams having a uniform characteristic. (3) No consideration has been given to factors as described earlier, i.e., control over affixing angles of the carbon nanotubes to the electrically-conductive substrate, and contact electrical-resistances and joint strengths between the carbon nanotubes and the electrically-conductive substrate. (4) Since the carbon nanotubes have individual differences in configuration, electrical resistance, and the like, emission-current amounts needed for stabilizing the emission current also differ from each other on each carbon-nanotube basis. This makes it difficult to control the emission-current amounts in a standardized manner. Namely, if the emission-current amounts needed for stabilizing the emission current are controlled in the standardized manner, in some cases, the standardized emission-current amount proves to be insufficient for a certain carbon nanotube to stabilize the emission current. Otherwise, the standardized emission-current amount is found to be an excessive one. This speeds up wearing-out of the carbon nanotube, or results in a breakage thereof.

As explained earlier, the field-emission cathode FEC according to the present invention includes the single carbon nanotube 14. This characteristic makes it possible to control in a standardized manner the emission-current amounts needed for stabilizing the emission current.

The inventor et al. have experimentally found out that, when the emission current from the single carbon nanotube 14 becomes unstable, the emission current is stabilized by boosting the extracting voltage for 5 to 900 seconds to increase the emission current up to 1 to 100 μA. The inventor et al. have also found that this stabilization is attributed to the fact that a tip-end portion of the carbon nanotube 14 has been clarified by the following causes: Namely, self heat-liberation of the carbon nanotube 14 by Joule heat causes remaining gas molecules to leave away therefrom. Here, the gas molecules have adhered to the tip-end portion of the carbon nanotube 14, and become a cause for the emission-current variation. In addition thereto, the self heat-liberation causes amorphous carbon covering surface of the carbon nanotube 14 to leave away therefrom.

Also, the heat flashing based on the current-pass heating, which is applied as the emission-current stabilization method for the conventional tungsten cathode, has been performed with respect to the carbon-nanotube cathode FEC according to the present embodiment. In this case, it has been found that the emission current is not stabilized, but rather becomes more unstable. This phenomenon is considered to be attributed to a cause that gases, which have left away from the support base or the like constituting the cathode FEC, adhere to the carbon nanotube 14.

Moreover, in the emission-current stabilization method according to the present embodiment, there has occurred none of the heat deformation of the cathode which usually occurs in the above-described heat flashing.

Figure 5:
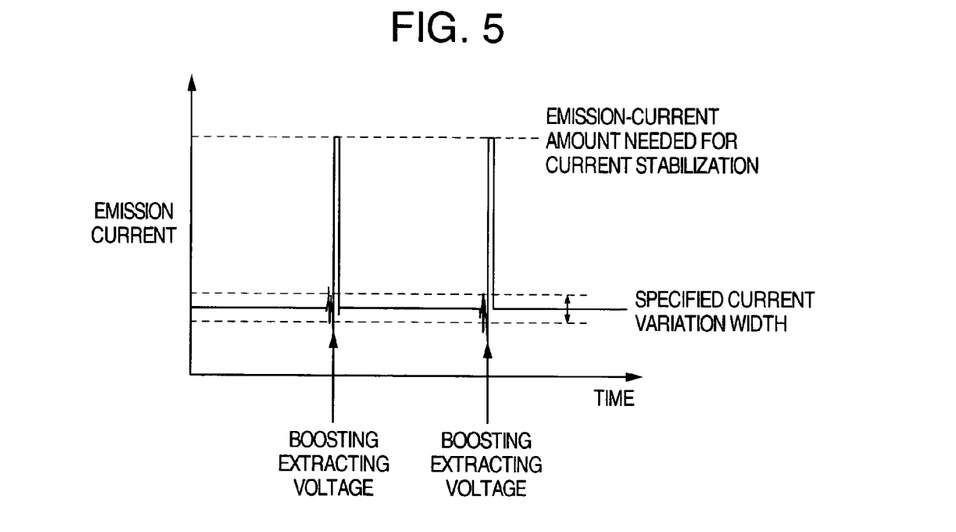
FIG. 5 illustrates a time-lapse change in the emission current in the field-emission cathode according to the present invention.
Figure 6:
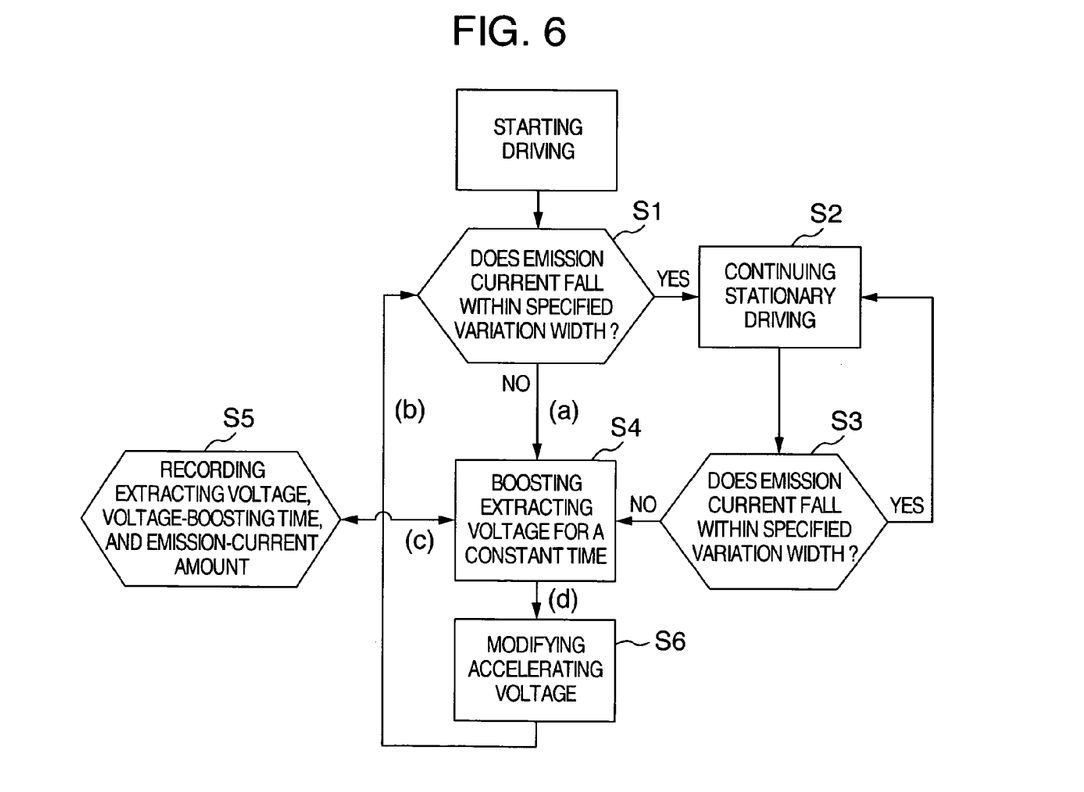
FIG. 6 illustrates a flowchart of basic driving method for the field-emission electron gun according to the present invention.

Next, referring to FIG. 5 and FIG. 6, the explanation will be given below concerning the driving method of driving the field-emission electron gun to which the above-described method has been applied. FIG. 5 is a diagram for illustrating a time-lapse change in the emission current in the field-emission cathode FEC according to the present invention. FIG. 6 is a diagram for illustrating a flowchart of a basic driving method of driving the field-emission electron gun according to the present invention. As illustrated in FIG. 5, a specified current variation width with respect to a certain emission-current amount is set, and, the emission-current monitor device 12 illustrated in FIG. 3 always monitors whether or not the emission current has got out of the specified current variation width (steps S1, S2, and S3). If the emission current has exceeded the specified current variation width, the power-supply control device 13 boosts the extracting voltage for a constant length of time, thereby increasing the emission current so as to stabilize the emission current ((a), steps S1–S4). Here, the concrete method of increasing the emission current is such that the emission current is not increased in a skyrocketing manner at a first time, but is increased in a step-by-step manner while monitoring a current variation after the emission-current increasing (steps S4, S5, S6, and S1). Namely, if the emission current has not fallen within the specified current variation width under the first-time emission-current increasing conditions (i.e., the extracting voltage, its voltage-boosting time, and the emission current), the emission-current increasing is performed once again under a somewhat stronger emission-current increasing condition (i.e., the emission current is increased, or the voltage-boosting time of the extracting voltage is lengthen) (b). In this case, the previous-time emission-current increasing conditions are beforehand stored into the feed-back control circuit integrated in the power-supply control device 13. Then, the previous-time emission-current increasing conditions are feed-backed to the next-time emission-current increasing condition, thereby performing the emission-current increasing under the suitable condition (c). This allows prevention of the drawbacks due to excessive emission current, such as the wearing-out and destruction of the carbon nanotube 14 and melting and discharge of the electrically-conductive substrate 16.

Also, the accelerating voltage is boosted in correspondence with the voltage-boosting of the extracting voltage (d), thereby maintaining the voltage ratio therebetween at a constant value. This allows prevention of the optical-axis shift (step S6).

The above-described electron-gun structure and its driving method make it possible to acquire the emission current which is continuous and stable for a long time.

(Application Embodiment 1 Applied to Electron-beam Instruments)

Figure 7:
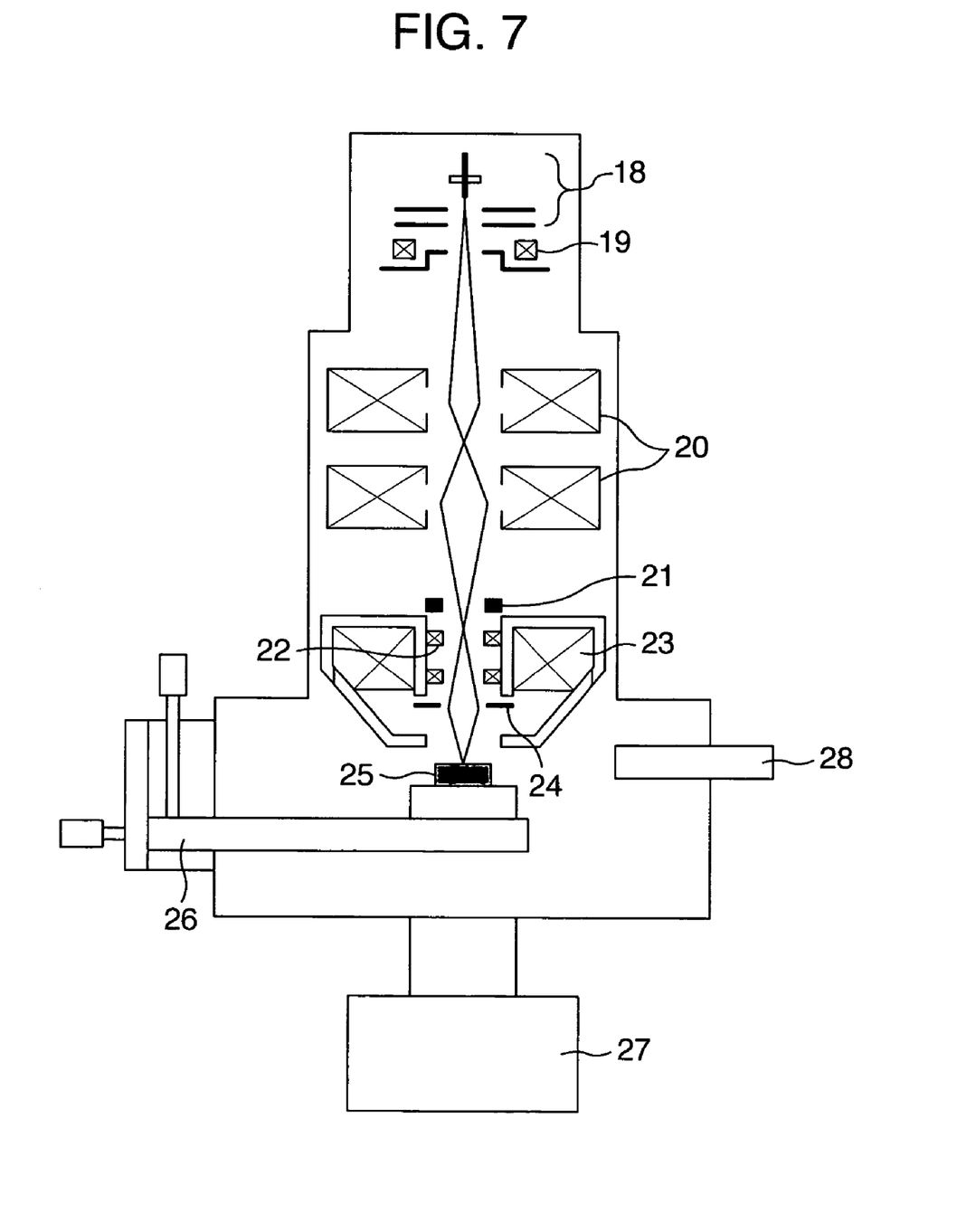
FIG. 7 illustrates an entire configuration embodiment of a scanning electron microscope which uses the field-emission electron gun according to the present invention.

FIG. 7 illustrates an entire configuration diagram of a scanning electron microscope (: SEM) mounting thereon the electron gun according to the present invention. The scanning electron microscope, along an electron beam emitted from the electron gun 18, locates therein an alignment coil 19, condenser lenses 20, an astigmatic correction coil 21, deflection/scanning coils 22, an objective lens 23, and an objective diaphragm 24. A sample 25 is set on a sample stage 26 so that the sample 25 can be irradiated with the electron beam. A secondary-electron detector 28 is provided on a side-wall portion within a sample chamber. Also, the sample chamber is maintained under high vacuum by an exhaust system 27. From the configuration as explained above, the electron beam emitted from the electron gun is accelerated at the anode, then being converged by the electronic lens. Next, an infinitesimal area on the sample is irradiated with the converged electron beam. Moreover, this irradiation area is two-dimensionally scanned, and such electrons as secondary electrons or reflected electrons emitted from the sample are detected by the secondary-electron detector 28. Finally, an enlarged image is formed based on a difference in amounts of the detected signals.

The electron gun and its driving method according to the present invention are applied to the scanning electron microscope. This application allows implementation of the scanning electron microscope which is capable of acquiring a secondary-electron image or reflected-electron image continuously and stably for a long time. Here, the secondary-electron image or reflected-electron image exhibits a resolution and luminescence which is exceedingly higher as compared with the conventional type.

On account of this characteristic, the electron gun and its driving method according to the present invention are also applicable to the critical-dimension (CD) SEM. The critical-dimension SEM performs observation and size length-measuring of a micromachining pattern in a semiconductor process which absolutely necessitates long-time continuous driving of the electron gun. Here, it was impossible to execute the long-time continuous driving of the conventional field-emission electron gun including the single-crystal tungsten cathode which necessitates the conventional heat flashing. Incidentally, the basic configuration of electro-optical system of the critical-dimension SEM is basically the same as the one illustrated in FIG. 7.

Incidentally, the configuration of the scanning electron microscope mounting thereon the field-emission electron gun is not limited to the one illustrated in FIG. 7. Instead, whatever conventional and well-known configuration is employable as long as the configuration is a one which allows the characteristics of the field-emission electron gun to be fully derived.

(Application Embodiment 2 Applied to Electron-beam Instruments)

Figure 8:
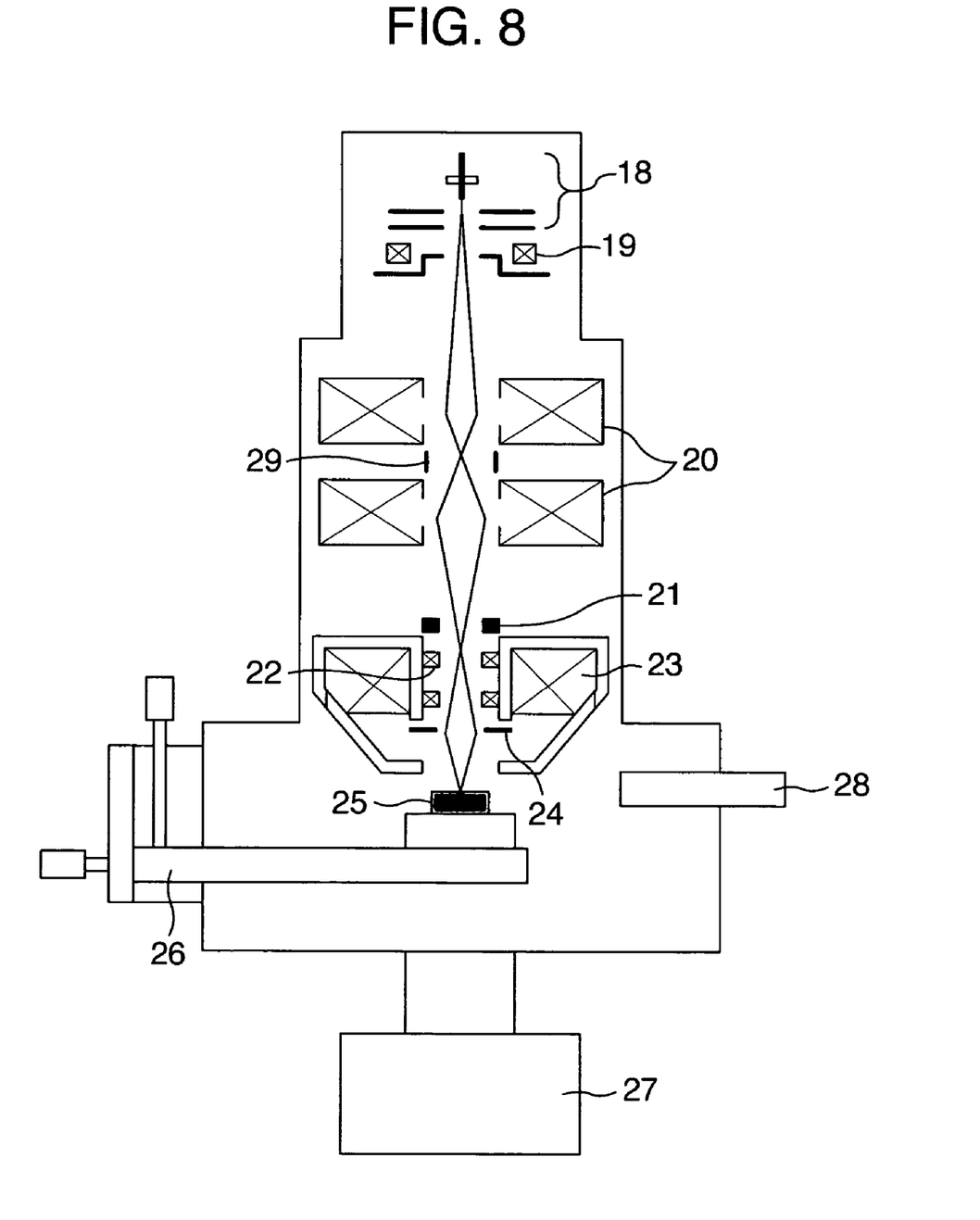
FIG. 8 illustrates an entire configuration embodiment of an electron-beam graphics-drawing instrument which uses the field-emission electron gun according to the present invention.

FIG. 8 illustrates an entire configuration embodiment of an electron-beam graphics-drawing instrument mounting thereon the electron gun according to the present invention. The basic configuration of electro-optical system thereof is substantially the same as the above-described scanning electron microscope. An electron beam acquired from an electron gun 18 by electric-field radiation is focused by condenser lenses 20, then being converged onto a sample 25 by an objective lens 23. This allows acquisition of a beam spot of nano-meter order. At this time, it is advisable that the center of a blanking electrode 29 for controlling ON/OFF of the electron-beam irradiation onto the sample 25 coincide with a cross-over point created by the condenser lenses 20.

The electron-beam graphics drawing is carried out as follows: Namely, while performing the ON/OFF of the electron beam by the blanking electrode 29, the electron-beam irradiation is performed while deflecting and scanning the electron beam on the sample 25 by deflection/scanning coils 22.

In the electron-beam graphics-drawing instrument, the sample substrate on which electron-beam sensitive photo-resist is coated is irradiated with an electron beam, thereby forming each type of circuit pattern. In recent years, however, an electron gun which allows acquisition of an extremely-narrow probe diameter has become necessary in accompaniment with the high-definition implementation of each type of circuit pattern. Conventionally, the thermoelectron-emission electron sources including tungsten filament or $LaB_6$ have been used. These electron guns exhibit an advantage of being able to generate a large amount of beam current. These electron guns, however, exhibit a huge astigmatic aberration caused by magnitude of the absolute emitter tip-end radius, thereby making it impossible to execute a 20-nm-or-less graphics drawing. On account of this, in recent years, the field-emission electron gun including the single-crystal tungsten cathode has come to be used. However, this electron gun generates the small amount of beam current, and, as explained earlier, results in the new problem of instability of the beam current. Accordingly, executing an accurate and secure graphics drawing requires that light-exposure amount of the beam current, i.e., light-exposure time thereof, be increased. This gives rise to a problem of low efficiency. The application of the electron gun and its driving method according to the present invention makes it possible to solve these problems.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A field-emission electron gun, comprising:
 a field-emission cathode including a single fiber carbon substance and an electrically-conductive substrate for supporting said substance,
 an extractor for field-emitting electrons,
 an accelerating electrode for accelerating said electrons,
 an extracting power-supply for applying extracting voltage to said extractor,
 an accelerating power-supply for applying accelerating voltage to said accelerating electrode, and
 means for detecting and monitoring a part of emission current, wherein there is provided a device which, if said emission current has exceeded a specified current variation width, automatically boosts said extracting voltage for a constant length of time, and thereby increases said emission current up to a predetermined value so as to stabilize said emission current.

2. The field-emission electron gun according to claim 1, further comprising a device for recording extracting voltage at the time of boosting said extracting voltage, voltage-boosting time, and said emission current, and for feed-backing said recorded data to voltage-boosting conditions for the next-time extracting voltage.

3. The field-emission electron gun according to claim 1 or claim 2, further comprising a device for varying said accelerating voltage in correspondence with said voltage-boosting of said extracting voltage.

4. The field-emission electron gun according to claim 1, wherein, if said emission current has exceeded said specified current variation width, said extracting voltage is automatically boosted for 5 to 900 seconds, and thereby said emission current is increased up to 1 to 100 μA.

5. The field-emission electron gun according to claim 1, wherein said field-emission cathode including said single fiber carbon substance includes a carbon nanotube.

6. A driving method of driving said field-emission electron gun according to claim 1.

7. A field-emission electron microscope mounting thereon said field-emission electron gun according to claim 1.

8. A critical-dimension (CD) SEM mounting thereon said field-emission electron gun according to claim 1.

9. An electron-beam graphics-drawing instrument mounting thereon said field-emission electron gun according to claim 1.

* * * * *